United States Patent
Barge

(10) Patent No.: US 9,812,371 B2
(45) Date of Patent: Nov. 7, 2017

(54) METHODS FOR REDUCING METAL CONTAMINATION ON A SURFACE OF A SAPPHIRE SUBSTRATE BY PLASMA TREATMENT

(71) Applicant: Soitec, Bernin (FR)

(72) Inventor: Thierry Barge, Chevrieres (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/078,902

(22) Filed: Mar. 23, 2016

(65) Prior Publication Data
US 2016/0284608 A1    Sep. 29, 2016

(30) Foreign Application Priority Data

Mar. 24, 2015 (FR) .................... 15 52416

(51) Int. Cl.
*H01L 21/20* (2006.01)
*H01L 21/263* (2006.01)
(Continued)

(52) U.S. Cl.
CPC ........ *H01L 21/86* (2013.01); *H01L 21/02046* (2013.01); *H01L 21/2011* (2013.01); *H01L 21/263* (2013.01); *H01L 21/76251* (2013.01); *H01L 29/0649* (2013.01)

(58) Field of Classification Search
CPC ............. H01L 21/86; H01L 21/02046; H01L 21/2011; H01L 21/26; H01L 21/263; H01L 21/76251; H01L 21/02; H01L 21/762; H01L 21/31; H01L 21/76254; H01L 21/304; H01L 21/3065; H01L 29/06; H01L 29/0649
(Continued)

(56) References Cited

U.S. PATENT DOCUMENTS

2012/0015497 A1*  1/2012  Gaudin ............. H01L 21/187
                                                      438/455
2012/0178259 A1*  7/2012  Miyazaki ......... H01L 21/02057
                                                      438/694

FOREIGN PATENT DOCUMENTS

CN      101912855 A     12/2010
CN      102218410 A     10/2011
(Continued)

OTHER PUBLICATIONS

Zhang et al., Recent Progress on Critical Cleaning of Sapphire Single-Crystal Substrates: a Mini-Review, Recent Patents on Chemical Engineering, vol. 6, (2013), pp. 161-166.
(Continued)

*Primary Examiner* — Marc Armand
*Assistant Examiner* — Younes Boulghassoul
(74) *Attorney, Agent, or Firm* — TraskBritt

(57) ABSTRACT

The present disclosure relates to a method for reducing metal contamination on a surface of a substrate. The method involves plasma treatment of the surface of the substrate by ion bombardment, wherein a plasma of a supplied gas is generated, and a bombardment energy of the ions in the plasma is controlled by a radio frequency electromagnetic field. The bombardment energy of the ions is higher than a first threshold so as to tear the metal contamination from the surface of the substrate, and the bombardment energy of the ions is lower than a second threshold so as to prevent a surface quality degradation of the surface of the substrate.

20 Claims, 1 Drawing Sheet

(51) Int. Cl.
   *H01L 21/86*     (2006.01)
   *H01L 21/762*    (2006.01)
   *H01L 29/06*     (2006.01)
   *H01L 21/02*     (2006.01)

(58) Field of Classification Search
   USPC ............ 257/507, 506, 72, E21.567, E21.24;
                    438/455, 34, 694; 118/620; 134/1.1, 1.2
   See application file for complete search history.

(56) References Cited

FOREIGN PATENT DOCUMENTS

| | | |
|---|---|---|
| CN | 103537453 A | 1/2014 |
| FR | 2938702 A1 | 5/2010 |

OTHER PUBLICATIONS

French Preliminary Search Report, for French Application No. FR3034252, dated Jan. 16, 2016, 2 pages.
French Written Opinion for French Application No. FR3034252, dated Mar. 24, 2015, 6 pages.
Higurashi et al., "Room Temperature GaN-GaAs Direct Bonding by Argon Beam Surface Activation", Proceedings of the SPIE, vol. 6717, No. 1, Oct. 8, 2007, pp. 67170L-1-67170L-8, XP002753096, The International Society for Optical Engineering USA, ISSN: 0277-786X.
Korner et al., "Hydrogen Plasma Chemical Cleaning of Metallic Substrates and Silicon Wafers", Surface Ands Coatings Technology, vol. 76-77, Dec. 1, 1995, pp. 731-737, XP022392965, Elsevier, Amsterdam, NL, ISSN:0257-8972—Entire Document.

* cited by examiner

METHODS FOR REDUCING METAL CONTAMINATION ON A SURFACE OF A SAPPHIRE SUBSTRATE BY PLASMA TREATMENT

PRIORITY CLAIM

Pursuant to 35 U.S.C. §119(a), this application claims the benefit of the filing date of French Patent Application Serial No. 1552416, filed Mar. 24, 2015, for "Method for Reducing the Metal Contamination on a Surface of a Substrate," the contents of which are incorporated herein in their entirety by this reference.

TECHNICAL FIELD

The present invention is related to a method for reducing the metal contamination on a surface of a substrate. Those substrates are notably used in the field of microelectronics, micromechanics, photonics and LED (light-emitting diode) devices.

BACKGROUND

One of the challenges in semiconductor device processing is the problem of metal contamination on the substrate surface. Semiconductor devices are extremely sensitive to minute quantities of metals present on the surface or inside the substrates. These metallic species are well known to deteriorate the electrical performance of the active layer. The silicon substrate industry is very mature and major suppliers are able to provide material with very low levels of metal contamination (at the surface and in bulk). The sapphire ($Al_2O_3$ single crystal) industry, one of the most important metal oxides with wide applications in the semiconductor industry, is less mature, even though it has been improving in recent years. Particularly, sapphire wafers are used for Silicon-on-Sapphire (hereafter "SOS") fabrication, but also as substrates for deposition of III-nitride films for LED devices. Due to a lower manufacturing maturity, sapphire wafers can be contaminated at different steps of substrate preparation and handling processes like polishing, storage and characterization. A large quantity of metal contamination can often be found on the surface of a sapphire substrate used for semiconductor devices. The metal contamination mainly comprises Ti, Fe and Ni elements, which are typically present in the slurry used to polish the sapphire surface.

In the fabrication processes of SOS substrates, a thin active silicon layer is grown or transferred onto a sapphire substrate. The high temperature thermal treatments carried out during or after the fabrication process of SOS substrates trigger the migration of the metal species from the surface of the sapphire substrate toward the silicon layer, thus rendering the SOS substrates incompatible with the manufacturing of electronic devices. Particularly, the diffusion velocity of the iron in the silicon is high and its solubility in silicon is very low. Under the condition of significant iron contamination, iron silicide precipitates can form in the thin active silicon layer and degrade its electrical integrity.

The RCA cleaning sequence is a standard method for cleaning a silicon surface. However, a sapphire substrate is more chemically inert than silicon, and requires more aggressive chemical treatments for etching its surface and dissolving metallic contaminants.

Chinese Patent CN102218410 recites a method for cleaning the surface of a polished sapphire substrate comprising successive wet treatments based on basic and acidic solutions, including ammonia peroxide mixtures, sulfuric peroxide mixtures and HF mixtures. It teaches that organic and inorganic compounds and metal ions can be effectively removed.

In Chinese Patent CN103537453, the invention relates to a method for cleaning a polished sapphire substrate based on ultrasonic baths, able to remove particles, metal ions and organics compounds.

In Chinese Patent CN101912855, the invention relates to a water polishing solution prepared from neutral media. By carrying out water polishing with the abovementioned solution immediately after alkaline polishing is finished, the residual CMP polishing solution can be flushed away, easily-cleaned materials can be adsorbed, the surface tension can be quickly reduced, thereby obtaining a clean polished surface.

In another document, Dan Zhang and Yang Gan make a general review of wet and dry cleaning processes applied to sapphire single crystal substrates ("Recent Progress on Critical Cleaning of Sapphire Single Crystal Substrates: A Mini-Review"—Recent Patents on Chemical Engineering, 2013, vol. 6, (pp. 161-166). Among different cleaning processes, they review, in particular, UV and plasma irradiation able to remove thin layers of organic contaminants, but with most inorganic contaminants remaining unaffected. They also note a change in surface morphology after this type of treatment.

The metal contamination elements can be located at the surface and in the sub-surface of substrates, from 0.5 nm to 1.5 nm deep, for example, and possibly up to 5.0 nm deep. This is usually why wet treatments reacting only with the surface of the substrate are not sufficiently efficient and do not meet the specific requirements for the manufacturing of electronic devices. Additionally, for substrates with low reactivity to chemicals, such as sapphire, wet treatments are inefficient to dissolve all metal contaminant elements, even at the surface of the substrate, depending on the chemical bonds of those elements.

Chemical-mechanical polishing can eventually remove the sub-surface contaminated layer, but it remains difficult to prevent slurry contaminant residues and their slight diffusion at the close surface, and it is difficult or impossible to reach the targeted levels of residual metal contaminants.

Alternatively, a wet cleaning step based on phosphoric acid ($H_3PO_4$) chemistry and performed at high temperature (100° C. or higher) can be efficient to remove metal contamination at the surface and close sub-surface; nevertheless, this type of solution is difficult to implement in an industrial infrastructure due to safety and the degraded reliability of bath heater elements at such high temperatures. Moreover, a residual contamination of phosphorus has been observed at the surface after such treatments, which may be unacceptable for certain targeted electronics applications given that phosphorus is a dopant for silicon.

The wet or dry chemical etch solutions currently existing are either inefficient to remove metal contamination at the surface of substrates having low reactivity (such as sapphire) or, when efficient, at least partially, they may degrade the substrate surface (local surface pitting, increased roughness, etc.) to an extent that the substrate is not suitable for further use.

In view of the above, a first technical objective of the present disclosure is to develop a more efficient metallic contaminant cleaning method.

Another technical objective of the present disclosure is to provide a method, which limits surface degradation, in order to be compatible with a direct molecular adhesion process in which one substrate is directly bonded onto another substrate along the surface previously treated by the metallic contaminant cleaning method.

BRIEF SUMMARY

The present disclosure relates to a method for reducing the metal contamination on a surface of a substrate comprising a plasma treatment of the surface of the substrate by ion bombardment, wherein a plasma of a supplied gas is generated and wherein a bombardment energy of the ions in the plasma is controlled by a radio frequency electromagnetic field. The bombardment energy of the ions is higher than a first threshold to tear the metal contamination, and the bombardment energy of the ions is lower than a second threshold to prevent a surface quality degradation of the surface of the substrate.

The present disclosure aims to remove the metal contaminants on a substrate surface without degrading the surface quality, notably in terms of roughness and defectivity.

According to various advantageous characteristics of the present disclosure, taken individually or combined together:
  the invention enables the metal contamination to be reduced to lower than $2E^{10}$ atoms/cm$^2$,
  the metal contamination may comprise Ti and/or Ni and/or Fe elements,
  the substrate may have a hardness above 5 (Mohs hardness scale), and preferably above 7,
  the substrate may be an insulator, for example, sapphire,
  the substrate may be a semiconductor, for example, silicon.

According to a preferred embodiment of the present disclosure:
  the supplied gas may comprise at least one noble gas element, preferably argon,
  the radio frequency electromagnetic field may provide a power density between 0.8 watts/cm$^2$ and 4.0 watts/cm$^2$, preferably between 2.0 watts/cm$^2$ and 3.0 watts/cm$^2$,
  the supplied gas may have a gas pressure between 30 millitorr and 120 millitorr,
  the supplied gas may be delivered at a gas flow of 75 sccm,
  the plasma treatment may last for a time in a range extending from 10 seconds to 60 seconds.

The present disclosure relates also to a bonding process to form a bond between a plasma-treated sapphire substrate surface and a semiconductor substrate surface, such as a silicon substrate, by wafer bonding, wherein the metal contamination on the sapphire substrate surface is reduced by a plasma treatment involving ion bombardment, wherein a plasma of a supplied gas is generated and wherein a bombardment energy of the ions in the plasma is controlled by a radio frequency electromagnetic field. The bombardment energy of the ions is higher than a first threshold to tear the metal contamination, and the bombardment energy of the ions is lower than a second threshold to prevent a surface quality degradation of the surface of the substrate.

In an advantageous embodiment, the bonding process comprises a step of a thermal treatment to increase the bonding strength between a plasma-treated sapphire substrate surface and a semiconductor substrate surface.

The present disclosure also relates to a substrate comprising a plasma-treated sapphire substrate surface and a semiconductor substrate surface, wherein bonding is formed by wafer bonding between these two surfaces, wherein the metal contamination on the sapphire substrate surface is reduced by a plasma treatment of ion bombardment, wherein a plasma of a supplied gas is generated and wherein a bombardment energy of the ions in the plasma is controlled by a radio frequency electromagnetic field. The bombardment energy of the ions is higher than a first threshold to tear the metal contamination, and the bombardment energy of the ions is lower than a second threshold to prevent a surface quality degradation of the surface of the substrate.

BRIEF DESCRIPTION OF THE DRAWINGS

FIG. 2 shows RMS ("root mean square") roughness values.

DETAILED DESCRIPTION

Figure 1:
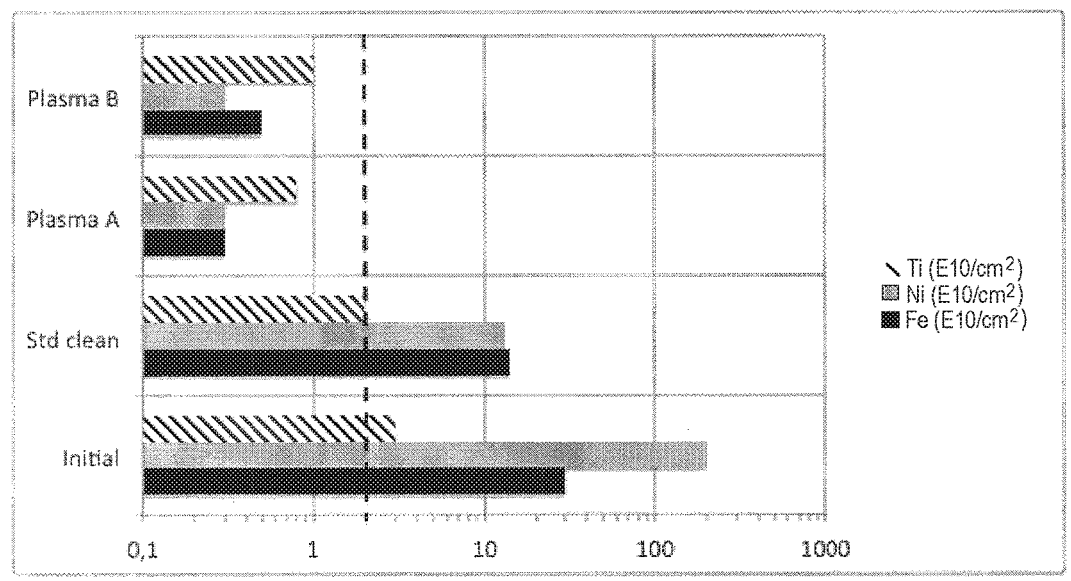
FIG. 1 depicts the level of metal contamination at the surface of a sapphire substrate, initially and after various cleaning treatments in accordance with embodiments of the present disclosure. The metal contamination levels of three different elements (Fe, Ni, and Ti) are indicated in number of atoms per square centimeter.

The present disclosure relates to a method for reducing the metal contamination on a surface of a substrate comprising a plasma treatment of the surface of the substrate by ion bombardment, wherein a plasma of a supplied gas is generated and wherein a bombardment energy of the ions in the plasma is controlled by a radio frequency (RF) electromagnetic field. The bombardment energy of the ions is higher than a first threshold to tear the metal contaminants from the substrate surface, and the bombardment energy of the ions is lower than a second threshold to prevent a surface quality degradation of the substrate surface.

In some embodiments, the plasma may be generated from at least one kind of noble gas. As a non-limiting embodiment, a pure noble gas, chosen among He, Ne, Ar, Kr, Xe, may be used. A mixture of different noble gases may also be used. Noble gases may be preferred relative to other gases, such as reactive gases like chlorine and boron chloride, to avoid generation of by-products and chlorine contamination.

It is also possible to mix a noble gas or gases with hydrogen gas.

The plasma may be formed in a plasma chamber by delivering the gas into the plasma chamber during the treatment at a controlled flow rate of 75 sccm and at a pressure between 30 millitorr and 120 millitorr. The pressure may be controlled using a vacuum pump connected to the plasma chamber.

The bombardment energy of the ions in the plasma may be primarily dependent on the RF power. A radio frequency electromagnetic field within the plasma chamber is set at a power between 200 watts and 1000 watts, to control the bombardment energy of the ions on the substrate surface (for wafers having a diameter of 150 mm, for example). This corresponds to a power density ranging from around 0.8 watts/cm$^2$ to 4.0 watts/cm$^2$. Advantageously, the power density may range from 1.5 watts/cm$^2$ to 4.0 watts/cm$^2$.

In order to have a homogeneous and stable result, the plasma treatment may be conducted for a time period in a range extending from 10 seconds to 60 seconds.

The plasma treatment according to the above parameters is efficient to remove the surface and sub-surface metal contamination from the substrate and to keep defectivity and roughness at a level compatible with a high-quality direct bonding process. For this purpose, the surface roughness will be preferably maintained below 0.5 nm RMS, and even advantageously below 0.4 nm RMS (AFM measurement on scanned areas of 2 µm×2 µm, 10 µm×10 µm and 40 µm×40 µm).

The present disclosure is particularly advantageous for the plasma treatment of substrate surfaces of substrates having low chemical reactivity (i.e., inert), and in particular substrates made of a material having a hardness higher than 5 on the Mohs scale. It is even of more interest for materials having a hardness higher than 7 (Mohs scale).

For such materials, the bombardment energy of the ions must reach the surface sputtering energy in order to successfully remove a few atomic layers from the surface and efficiently break bonds between the metal contaminant elements and the surface and sub-surface. Nevertheless, the bombardment energy may be controlled so as to avoid a surface degradation that would prevent subsequent high-quality direct molecular bonding of the substrate to another substrate.

The cleaning method, according to the invention, may be useful for cleaning sapphire substrates, for example.

The applicant has found that metal contamination on such substrates commonly comprises Ti, Ni and Fe elements. Those elements can be detrimental for further processing of the substrate. For instance, when an active layer of silicon is formed on a sapphire substrate exceeding $2E^{10}$ atoms/cm$^2$ of metal contamination, it induces silicide precipitates in the active silicon layer during or after the SOS fabrication process. The silicide precipitates degrade electrical properties of the active silicon layer.

As illustrated in FIG. 1, Ti, Ni and Fe contamination levels on the initial sapphire substrate, before any cleaning treatment, are higher than $2E^{10}$ atoms/cm$^2$; in particular, Fe and Ni levels are even higher than $2E^{11}$ atoms/cm$^2$. Contamination levels have been measured by total reflection X-ray fluorescence (TXRF). TXRF is a surface elemental analysis technique often used for the analysis of particles, residues, and impurities on smooth surfaces. It is currently an important tool for wafer surface contamination control in semiconductor chip manufacturing and, in particular, for analyzing surface metal contamination. The X-ray probe is known to penetrate into the surface of the substrate to a depth of about 5 nm, allowing the analysis of the surface and near sub-surface of substrates.

The plasma treatment, according to the present disclosure allows the level of metal contamination of a sapphire substrate to be reduced below a level of $2E^{10}$ atoms/cm$^2$, which is a suitable level for the subsequent manufacturing of electronic devices. As illustrated in FIG. 1, two conditions A and B of plasma treatment according to the present disclosure have been tested. They primarily show significantly better cleaning efficiency than a standard cleaning process (namely, an RCA cleaning process), which results are also depicted on FIG. 1. Both conditions, respectively performed with a power density of 2.0 watts/cm$^2$ (plasma A) and 4.0 watts/cm$^2$ (plasma B), all other parameters being identical for both conditions, show a good efficiency to remove metal contamination, especially for Fe and Ni species. A power density lower than 0.8 watts/cm$^2$ hasn't enabled metal contamination residues to be lower than the $2E^{10}$ atoms/cm$^2$ limit, required for the targeted application. This indicates that the associated bombardment energy of the ions was not above the first threshold to tear the metal contamination from the surface of the substrate. A power density higher than 1.5 watts/cm$^2$ is preferred to efficiently tear the metal contamination from the surface of the substrate.

Figure 2:
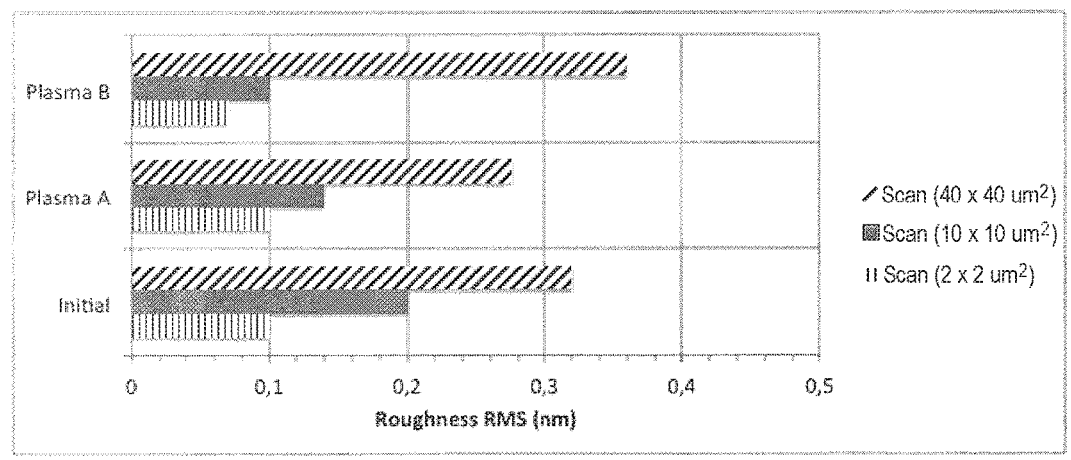
FIG. 2 depicts the roughness of a sapphire substrate surface after various cleaning treatments in accordance with embodiments of the present disclosure. The roughness is measured by Atomic Force Microscopy (AFM) on various scan areas, 2 μm×2 μm, 10 μm×10 μm and 40 μm×40 μm.

To fulfill the application requirements, the surface quality, after plasma treatment, must remain compatible with demanding processes, such as direct molecular bonding processes. The surface quality is evaluated, in the context of the present disclosure, using surface roughness measurements as can be seen in FIG. 2. In FIG. 2, roughness values are RMS values expressed in nanometers. Roughness measurements have been performed using an Atomic Force Microscope (AFM), on scanned areas of 2 µm×2 µm, 10 µm×10 µm and 40 µm×40 µm). As is well known in the industry, AFM is a high-resolution type of scanning probe microscopy, with demonstrated resolution on the order of fractions of a nanometer. The measurements on various scanned areas bring information on the surface quality on different ranges: a smaller scan (e.g., 2 µm×2 µm) is representative of short range roughness that could also be named micro-roughness; a middle scan (e.g., 10 µm×10 µm) is representative of mid-range roughness; and a larger scan (e.g., 40 µm×40 µm) is representative of long range roughness, closer to surface waviness.

FIG. 2 shows an example of surface roughness of an initial sapphire substrate and surface roughness of sapphire substrates after the two previously described conditions of plasma treatment, having, respectively, a power density of 2.0 watts/cm$^2$ (plasma A) and 4.0 watts/cm$^2$ (plasma B), all other parameters being identical for both conditions. Those two conditions are representative of two different bombardments energies of ions on the substrate surface.

The results show that the two conditions of plasma lead to expected surface quality in the short-range and mid-range roughness, typically according to AFM scans of 2 µm×2 µm and 10 µm×10 µm. Compared to initial surface roughness, the plasma treatments lead to either identical results, or even better ones.

In the long range roughness, according to AFM scans of 40 µm×40 µm the applicant has observed an increase of the roughness after the plasma treatment B, compared to the initial state. This is a preliminary manifestation of the surface degradation that defines the second bombardment threshold that should not be exceeded, so as to avoid detrimental surface degradation. The detrimental surface degradation state is typically reached when the surface roughness exceeds 0.5 nm RMS. In some circumstances, it is preferable to avoid the surface roughness exceeding 0.4 nm RMS.

According to a preferred embodiment, before the plasma treatment, the sapphire substrate can be submitted to a wet cleaning process, for instance, an RCA-type cleaning process, as a first step, to remove organic and particle contaminants.

After the plasma treatment of the sapphire substrate surface, the sapphire substrate can be prepared for direct wafer bonding onto a semiconductor substrate, which may be or comprise, for example, a silicon wafer. As is well known in the art, the principle of molecular bonding, also known as direct bonding, is based on placing two surfaces into direct contact, i.e., without using any specific bonding material (adhesive, wax, solder, etc.). Such an operation requires the surfaces for bonding to be sufficiently smooth, free from particles or contamination, and to be sufficiently close together to enable contact to be initiated, typically at a distance of less than a few nanometers. Under such circumstances, attractive forces between the two surfaces are high enough to cause molecular bonding to occur (bonding induced by all of the attractive forces (van der Waals forces) involving electron interaction between atoms or molecules of the two surfaces).

The plasma-treated sapphire substrate can thus be bonded onto the semiconductor substrate. Before the bonding, both substrates to be assembled can optionally be submitted to a wet clean and/or to a plasma activation treatment, notably to improve the subsequent bonding strengths between both substrates. In order to further increase the bonding strengths, a step of thermal treatment can also be applied to the bonded structure, after bonding.

After bonding, the semiconductor wafer of the bonded structure can be thinned by a known method such as, grinding, polishing, chemical etching, SMART CUT®, sacrificial oxidation, etc., in order to achieve a final substrate comprising the semiconductor active layer on top of the support substrate. This support substrate may be sapphire in the example of the SOS final substrate. Subsequent high temperature thermal treatments may be applied to the structure to consolidate the bonding interface and increase the bond strength between the bonded substrates. Such a thermal treatment may involve subjecting the bonded substrates to a temperature or temperatures ranging from 700° C. to 950° C., for example.

When a sapphire substrate has been efficiently cleaned before the bonding step, no degradation, due to metal contamination generated precipitates, is observed in the semiconductor top active layer.

An example of a specific embodiment according to the present disclosure is described below.

A 150 mm sapphire substrate as received from suppliers can have iron contamination on a top surface thereof, ranging from $5E^{10}$ atoms/cm$^2$ to $100E^{10}$ atoms/cm$^2$. The sapphire substrate is submitted to a plasma treatment, based on an argon gas at a gas flow of 75 sccm and a pressure of 50 milliTorr, for a duration of 30 seconds, with an RF power of 700 watts, corresponding to a power density of 2.8 watts/cm$^2$. After the plasma treatment of the sapphire substrate surface by ion bombardment, the metallic contamination on the surface is reduced. The iron level is around $0.8E^{10}$ atoms/cm$^2$. The metal contamination level of Ti and Ni elements is also reduced, respectively, from $3E^{10}$ atoms/cm$^2$ to $1E^{10}$ atoms/cm$^2$ and from $180E^{10}$ atoms/cm$^2$ to $0.4E^{10}$ atoms/cm$^2$ after plasma treatment.

The surface roughness is compatible with direct bonding, remaining around 0.1 nm RMS at short range and around 0.3 nm RMS at long range.

The sapphire substrate and a silicon substrate are then submitted to a standard RCA clean before bonding. The bonding between both substrates shows a good quality and the assembled structure is subsequently annealed at 150° C. then submitted to standard thinning and annealing processes to achieve the final substrate having a silicon active layer on top of a sapphire substrate.

The plasma treatment, according to the present disclosure, can also be successfully applied to ceramic substrates, for example, as aluminum nitride and silicon carbide. Those substrates, also exhibit low chemical reactivity to standard microelectronics chemicals, and are of increasing interest for various applications in the microelectronics field. The plasma treatment according to the present disclosure allows reduction of metal contamination on the surface and near sub-surface of new commercially available substrates, which currently exhibit contamination levels incompatible with many microelectronics standards.

The invention claimed is:

1. A method for reducing metal contamination on a surface of a sapphire substrate comprising a plasma treatment of the sapphire surface by ion bombardment, wherein a plasma of a supplied gas is generated and wherein a bombardment energy of ions in the plasma is controlled by a radio frequency electromagnetic field providing a power density between 2.0 watts/cm$^2$ and 3.0 watts/cm$^2$, the bombardment energy of the ions being higher than a first threshold sufficient to tear the metal contamination from the sapphire surface, and the bombardment energy of the ions being lower than a second threshold so as to prevent a surface quality degradation of the sapphire surface.

2. The method of claim 1, wherein the metal contamination is reduced to lower than $2E^{10}$ atoms/cm$^2$ by the plasma treatment of the sapphire surface by ion bombardment.

3. The method of claim 2, wherein the metal contamination comprises contaminations from one or more of Ti, Ni, and Fe.

4. The method of claim 1, wherein the supplied gas comprises a noble gas.

5. The method of claim 4, wherein the noble gas comprises argon.

6. The method of claim 1, wherein the supplied gas has a gas pressure between 30 millitorr and 120 millitorr.

7. The method of claim 1, wherein the supplied gas is delivered at a gas flow rate of 75 sccm.

8. The method of claim 1, wherein the plasma treatment is conducted for a duration of from 10 seconds to 60 seconds.

9. The method of claim 1, further comprising bonding the plasma-treated sapphire surface to a semiconductor substrate surface by wafer bonding to obtain a bonded structure.

10. The method of claim 9, further comprising thermally treating the bonded structure to increase a bonding strength between the plasma-treated sapphire surface and the semiconductor substrate surface.

11. A method for reducing metal contamination on a surface of a sapphire substrate comprising a plasma treatment of the sapphire surface by ion bombardment, wherein a plasma of a supplied gas is generated and wherein a bombardment energy of ions in the plasma is controlled by a radio frequency electromagnetic field providing a power density between 2.0 watts/cm$^2$ and 4.0 watts/cm$^2$, the bombardment energy of the ions being higher than a first threshold sufficient to tear the metal contamination from the sapphire surface, and the bombardment energy of the ions being lower than a second threshold so as to prevent a surface quality degradation of the sapphire surface, wherein a surface roughness of the sapphire surface remains below a root-mean-square (RMS) value of 0.5 nm.

12. The method of claim 11, wherein the metal contamination is reduced to lower than $2E^{10}$ atoms/cm$^2$ by the plasma treatment of the sapphire surface by ion bombardment.

13. The method of claim 12, wherein the metal contamination comprises contaminations from one or more of Ti, Ni, and Fe.

14. The method of claim 11, wherein the supplied gas comprises a noble gas.

15. The method of claim 14, wherein the noble gas comprises argon.

16. The method of claim 11, wherein the supplied gas has a gas pressure between 30 millitorr and 120 millitorr.

17. The method of claim 11, wherein the supplied gas is delivered at a gas flow rate of 75 sccm.

18. The method of claim 11, wherein the plasma treatment is conducted for a duration of from 10 seconds to 60 seconds.

19. The method of claim 11, further comprising bonding the plasma-treated sapphire surface to a semiconductor substrate surface by wafer bonding to obtain a bonded structure.

20. The method of claim 19, further comprising thermally treating the bonded structure to increase a bonding strength between the plasma-treated sapphire surface and the semiconductor substrate surface.

* * * * *